(12) United States Patent
Yamamoto

(10) Patent No.: US 10,651,239 B2
(45) Date of Patent: May 12, 2020

(54) STORAGE DEVICE

(71) Applicant: TOSHIBA MEMORY CORPORATION, Minato-ku, Tokyo (JP)

(72) Inventor: Kazuhiko Yamamoto, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,651

(22) Filed: Mar. 1, 2019

(65) Prior Publication Data
US 2020/0091235 A1 Mar. 19, 2020

(30) Foreign Application Priority Data
Sep. 18, 2018 (JP) ................. 2018-174321

(51) Int. Cl.
*H01L 27/24* (2006.01)
*H01L 45/00* (2006.01)
*G11C 13/00* (2006.01)

(52) U.S. Cl.
CPC ...... *H01L 27/2436* (2013.01); *G11C 13/0004* (2013.01); *H01L 45/1253* (2013.01); *H01L 45/144* (2013.01); *G11C 2213/71* (2013.01); *H01L 27/2409* (2013.01)

(58) Field of Classification Search
CPC ....... H01L 45/141–144; H01L 45/1253; H01L 45/1233
See application file for complete search history.

(56) References Cited

U.S. PATENT DOCUMENTS

| 8,574,954 B2 * | 11/2013 | Tang .................... H01L 27/2409 438/102 |
| 8,642,988 B2 | 2/2014 | Kinoshita et al. |
| 9,780,144 B2 * | 10/2017 | Seong .................... H01L 27/249 |
| 2006/0266992 A1 | 11/2006 | Matsui et al. |
| 2007/0170413 A1 | 7/2007 | Matsui et al. |
| 2018/0204881 A1 * | 7/2018 | Sei ....................... H01L 27/2481 |

OTHER PUBLICATIONS

A. Velea et al., "Te-based chalcogenide materials for selector applications", Scientific Reports, Mar. 23, 2017, www.nature.com/scientificreports.
Koo et al., "Te-Based Amorphous Binary OTS Device with Excellent Selector Characteristics for X-point Memory Applications", Department of Materials Science and Engineering, Pohang University of Science and Technology (POSTECH), 2016 IEEE, pp. 86-87.

* cited by examiner

*Primary Examiner* — Allison Bernstein
(74) *Attorney, Agent, or Firm* — Foley & Lardner LLP

(57) ABSTRACT

A storage device includes: a first conductive layer; a second conductive layer; and a resistance-variable layer disposed between the first conductive layer and the second conductive layer, and including a first chalcogenide containing a first element which is either silicon or germanium. An insulating layer is disposed in a second direction perpendicular to a first direction from the first conductive layer to the second conductive layer with respect to the resistance-variable layer. A first region is disposed between the resistance-variable layer and the insulating layer, and has a third concentration of the first element higher than both a first concentration of the first element in the resistance-variable layer and a second concentration of the first element in the insulating layer.

14 Claims, 6 Drawing Sheets

STORAGE DEVICE

CROSS-REFERENCE TO RELATED APPLICATIONS

This application is based upon and claims the benefit of priority from Japanese Patent Application No. 2018-174321, filed Sep. 18, 2018, the entire contents of which are incorporated herein by reference.

FIELD

Embodiments described herein relate generally to a storage device.

BACKGROUND

A resistance-variable memory transits between a high resistance state and a low resistance state when applied with a current to a resistance-variable layer of a memory cell. For example, when the high-resistance state is defined as data "0" and the low-resistance state is defined as data "1", the memory cell stores 1 bit data of "0" and "1".

Examples of the resistance-variable memory include a phase-variable memory using a resistance change caused by a phase change of a material constituting the resistance-variable layer. For example, a chalcogenide is used as the resistance-variable layer of the phase-variable memory. The chalcogenide is a compound containing sulfur (S), selenium (Se), or Te (tellurium), which are Group 16 elements (Group VI elements).

However, adhesion between the chalcogenide and silicon oxide or silicon nitride used as an insulating layer is weak. For this reason, for example, during manufacture of the resistance-variable memory, there is a problem that film peeling occurs and the resistance-variable memory cannot be manufactured.

Examples of related art include JP-A-2006-352082.

DETAILED DESCRIPTION

Figure 1:
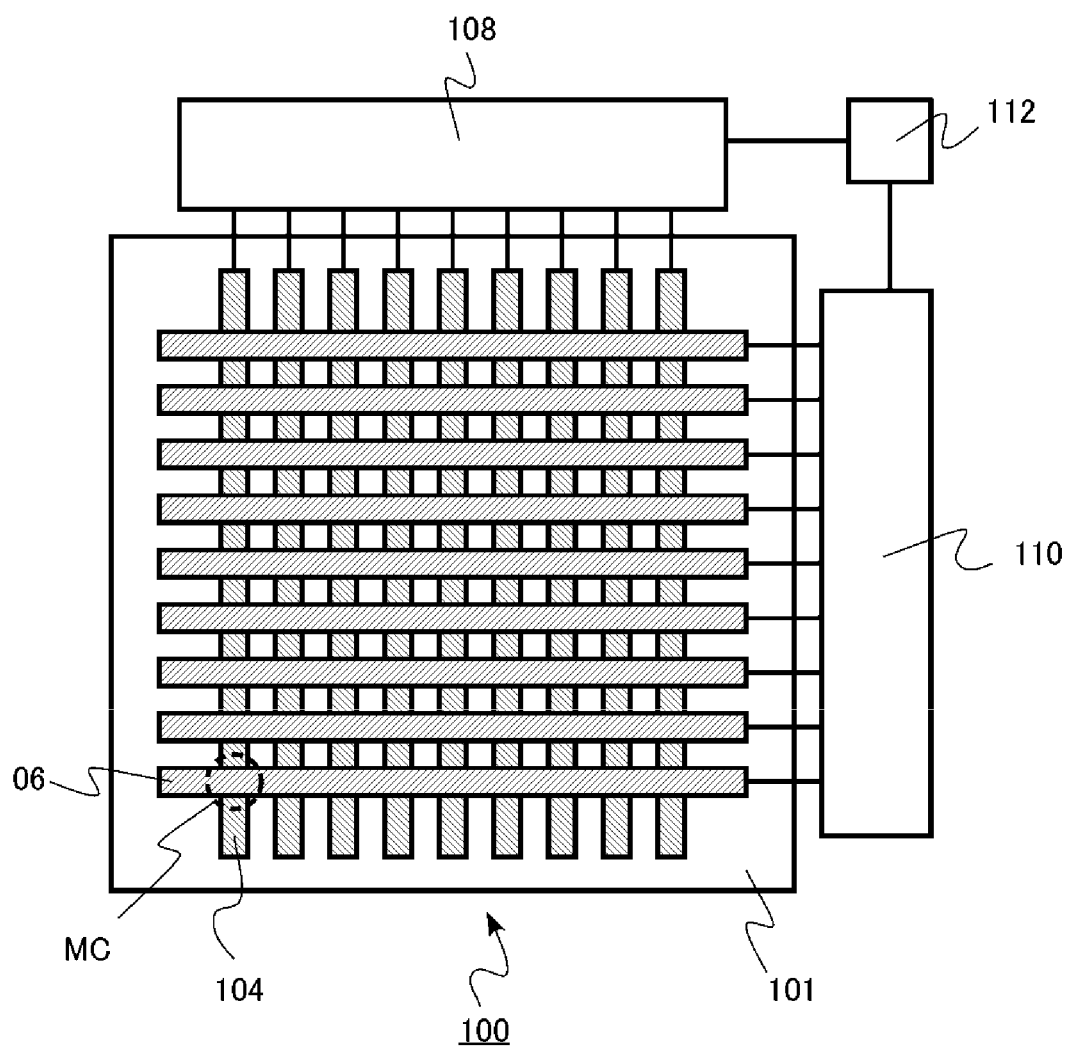
FIG. 1 is a block diagram of a storage device according to a first embodiment.

Embodiments provide a storage device having strong adhesion between a resistance-variable layer and an insulating layer.

In general, according to at least one embodiment, a storage device includes: a first conductive layer; a second conductive layer; a resistance-variable layer provided between the first conductive layer and the second conductive layer, and including a first chalcogenide containing a first element which is either silicon or germanium; an insulating layer provided in a second direction perpendicular to a first direction from the first conductive layer to the second conductive layer with respect to the resistance-variable layer; and a first region provided between the resistance-variable layer and the insulating layer, and having a third concentration of the first element higher than both a first concentration of the first element of the resistance-variable layer and a second concentration of the first element of the insulating layer.

Embodiments of the present disclosure will be described below with reference to the drawings. In the following description, the same or similar members are denoted by the same reference signs, and the description thereof will be appropriately omitted.

In the present Specification, the terms "upper" and "lower" are used for convenience. The terms "upper" and "lower" are merely terms indicating a relative positional relationship in the drawings, and do not define a positional relationship with respect to gravity.

Hereinafter, storage devices according to the embodiments will be described with reference to the drawings.

First Embodiment

A storage device according to a first embodiment includes: a first conductive layer; a second conductive layer; a resistance-variable layer provided between the first conductive layer and the second conductive layer, and including a first chalcogenide containing a first element which is either silicon or germanium; insulating layers provided in second directions perpendicular to a first direction from the first conductive layer to the second conductive layer with respect to the resistance-variable layer; and first regions provided between the resistance-variable layer and the insulating layers, and having a third concentration of the first element higher than both a first concentration of the first element of the resistance-variable layer and a second concentration of the first element of the insulating layers.

Figure 2:
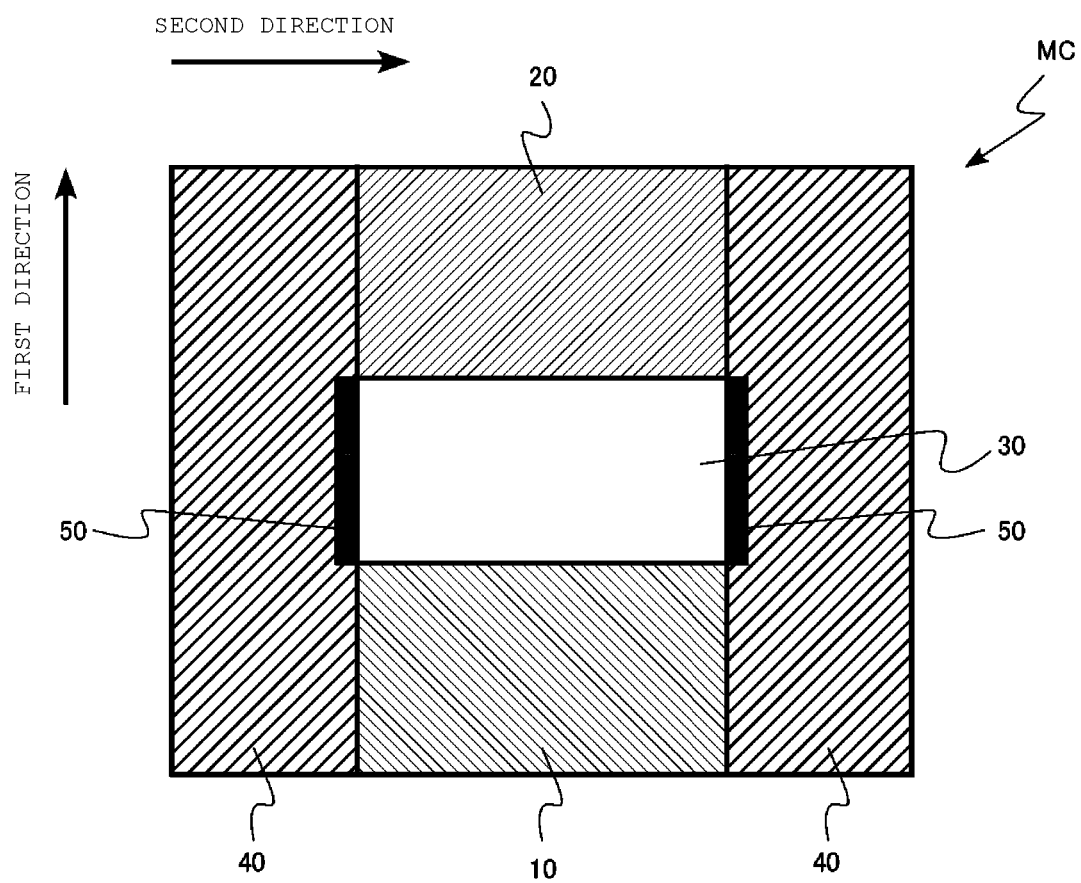
FIG. 2 is a schematic cross-sectional view of a memory cell of the storage device according to the first embodiment.

FIG. 1 shows a block diagram of the storage device according to the first embodiment. FIG. 2 is a schematic cross-sectional view of a memory cell of the storage device according to the first embodiment. FIG. 2 shows a cross section of one memory cell MC indicated by, for example, a dotted circle in a memory cell array 100 of FIG. 1.

The memory cell array 100 of the storage device according to the first embodiment includes on a semiconductor substrate 101, for example, a plurality of word lines 104 and a plurality of bit lines 106 intersecting the word lines 104, with insulating layers therebetween. The bit lines 106 are provided above the word lines 104. A first control circuit 108, a second control circuit 110, and a sense circuit 112 are provided around the memory cell array 100 as peripheral circuits.

A plurality of memory cells MC are provided in a region where the word lines 104 intersect the bit lines 106. The storage device according to the first embodiment is a resistance-variable memory having a cross-point structure. The memory cell MC is a two-terminal resistance-variable device. The storage device according to the first embodiment is a phase-variable memory including a chalcogenide in a resistance-variable layer.

Each of the plurality of word lines 104 is connected to the first control circuit 108. Each of the plurality of bit lines 106 is connected to the second control circuit 110. The sense circuit 112 is connected to the first control circuit 108 and the second control circuit 110.

The first control circuit 108 and the second control circuit 110 have a function of, for example, selecting a desired memory cell MC, writing data into the memory cell, reading data from the memory cell, erasing data from the memory cell, and the like. When data is read, the data of the memory cell is read as an amount of current flowing between the word lines 104 and the bit lines 106. The sense circuit 112 has a function of determining the current amount and determining a polarity of the data. For example, the sense circuit 112 determines whether the data is "0" or "1".

The first control circuit 108, the second control circuit 110, and the sense circuit 112 are formed of, for example, an electronic circuit using semiconductor devices formed on the semiconductor substrate 101.

As shown in FIG. 2, the memory cell MC includes a lower electrode 10 (an example of a first conductive layer), an upper electrode 20 (an example of a second conductive layer), a resistance-variable layer 30, interlayer insulating layers 40 (an example of insulating layers), and first interface regions 50 (an example of a first region).

The lower electrode 10 is connected to the word line 104. The lower electrode 10 is made of, for example, a metal. The lower electrode 10 is, for example, titanium nitride (TiN) or tungsten (W).

The upper electrode 20 is connected to the bit line 106. The upper electrode 20 is, for example, a metal. The upper electrode 20 is, for example, titanium nitride (TiN) or tungsten (W).

The resistance-variable layer 30 is provided between the lower electrode 10 and the upper electrode 20. The resistance-variable layer 30 includes a first chalcogenide. The first chalcogenide includes a first element which may be either silicon (Si) or germanium (Ge).

The chalcogenide is a compound containing sulfur (S), selenium (Se), or Te (tellurium), which is a Group 16 element (Group VI element).

The first chalcogenide is, for example, a chalcogenide containing germanium (Ge), antimony (Sb), and tellurium (Te). The first element is, for example, germanium.

By applying a current to the resistance-variable layer 30, the resistance-variable layer 30 changes from a high resistance state to a low resistance state or from the low resistance state to the high resistance state. The change from the high resistance state to the low resistance state is referred to as, for example, a set operation. The change from the low-resistance state to the high-resistance state is referred to as, for example, a reset operation.

Application of a current to the resistance-variable layer 30 changes the first chalcogenide from crystalline to amorphous or from amorphous to crystalline, thereby changing conductivity of the resistance-variable layer 30. An amorphous state is the high resistance state and a crystalline state is the low resistance state. The relationship between the crystal state and the resistance state may be reversed. Further, the resistance may be changed by changing bonding of atoms without changing the crystallinity.

The chemical formulation of the first chalcogenide is not limited as long as it is a chalcogenide of which the resistance changes upon phase change.

[The film thickness of the resistance-variable layer 30 is, for example, 5 nm or more and 25 nm or less. The resistance-variable layer 30 is, for example, a film formed by an atomic layer deposition (ALD) method.

The interlayer insulating layers 40 are provided at least in second directions perpendicular to a first direction from the lower electrode 10 to the upper electrode 20 with respect to the resistance-variable layer 30. The resistance-variable layer 30 is sandwiched between the interlayer insulating layers 40. The interlayer insulating layers 40 are provided on both sides of the resistance-variable layer 30.

The interlayer insulating layers 40 are, for example, an oxide, a nitride, or an oxynitride. The interlayer insulating layers 40 are, for example, silicon oxide, silicon nitride, or silicon oxynitride.

The first interface regions 50 are provided between the resistance-variable layer 30 and the interlayer insulating layers 40. The first interface regions 50 are provided on side surfaces of the resistance-variable layer 30. The first interface regions 50 have a third concentration of the first element higher than both a first concentration of the first element of the resistance-variable layer 30 and a second concentration of the first element of the interlayer insulating layers 40.

For example, when the first element is germanium, the concentration of germanium in the first interface regions (i.e., the third concentration) is higher than the concentration of germanium of the resistance-variable layer 30 (i.e., that first concentration) and the concentration of germanium of the interlayer insulating layers 40 (i.e., the second concentration).

The first interface regions 50 are regions formed by segregation of the first element at the interfaces between the resistance-variable layer 30 and the interlayer insulating layers 40. The width in the second direction of the first interface regions 50 is, for example, less than 0.5 nm or less than 0.4 nm.

For example, when the first chalcogenide contained in the resistance-variable layer 30 is a chalcogenide containing germanium (Ge), antimony (Sb), and tellurium (Te), and the interlayer insulating layers 40 are silicon oxide, the first interface regions 50 are, for example, silicon oxide containing germanium.

The elements contained in the resistance-variable layer 30, the interlayer insulating layers 40, and the first interface regions 50 may be identified by, for example, energy dispersive X-ray (EDX) spectroscopy. The magnitude relationship of the concentrations of the elements contained in the resistance-variable layer 30, the interlayer insulating layers 40, and the first interface regions 50 may be determined by, for example, EDX. The concentrations of the elements contained in the resistance-variable layer 30, the interlayer insulating layers 40, and the first interface regions 50 may be measured by, for example, electron energy-loss spectroscopy (EELS).

In addition, for example, transmission electron microscope (TEM) may be used to measure thicknesses of members constituting the storage device, distances between the members, and the like.

Next, an example of a method of manufacturing the memory cell MC according to the first embodiment will be described.

For example, when the resistance-variable layer 30 is formed on the lower electrode 10 by the ALD method, the first chalcogenide is formed to contain the surplus first element, compared with the first element that can be stably contained in the first chalcogenide.

For example, when the first chalcogenide included in the resistance-variable layer 30 is a chalcogenide containing germanium (Ge), antimony (Sb), and tellurium (Te), the first chalcogenide is formed so that surplus germanium is contained compared with germanium that can be stably contained in the first chalcogenide.

Then, the upper electrode 20 and the interlayer insulating layers 40 are formed. The interlayer insulating layers 40 are formed in contact with the side surfaces of the resistance-variable layer 30.

Next, annealing is performed at, for example, a temperature of 500° C. or higher and 900° C. or lower. The annealing is performed for, for example, 1 second to 3 seconds. Through such annealing, the surplus first element segregates at the interfaces between the resistance-variable layer 30 and the interlayer insulating layers 40, and the first interface regions 50 are formed.

Operations and advantageous effects of the storage device according to the first embodiment will be described below.

Adhesion between the chalcogenide and silicon oxide or silicon nitride used as an insulating layer is low. For this reason, during manufacture of the resistance-variable memory, there is a problem that film peeling occurs and the resistance-variable memory cannot be manufactured. A chalcogenide is unlikely to form a compound with other elements, and thus is considered to have low adhesion with an insulating layer.

The phase change memory according to the first embodiment has the first interface regions 50 having a high concentration of the first element between the resistance-variable layer 30 and the interlayer insulating layers 40. The first interface regions 50 having the high concentration of the first element improves the adhesion between the resistance-variable layer 30 and the interlayer insulating layers 40.

For example, when the first chalcogenide contained in the resistance-variable layer 30 is a chalcogenide containing germanium (Ge), antimony (Sb), and tellurium (Te), and the interlayer insulating layers 40 are silicon oxide, the first interface regions 50 are, for example, silicon oxide containing germanium at a high concentration. The first element is germanium.

By compounding silicon oxide containing germanium at the high concentration and the first chalcogenide containing germanium, adhesion between the resistance-variable layer 30 and the interlayer insulating layers 40 is improved.

As described above, according to the storage device according to the first embodiment, the adhesion between the resistance-variable layer and the insulating layers increases. Therefore, film peeling between the resistance-variable layer and the insulating layers is unlikely to occur during manufacture. Thereby, a storage device that can be stably manufactured is achieved.

Second Embodiment

A storage device according to a second embodiment differs from the storage device according to the first embodiment in that the storage device according to the second embodiment further includes: an intermediate layer provided between the first conductive layer and the resistance-variable layer, and including a second chalcogenide containing a second element which is either silicon or germanium; and second regions provided between the intermediate layer and the insulating layers, and having a sixth concentration of the second element higher than both a fourth concentration of the second element of the intermediate layer and a fifth concentration of the second element of the insulating layers. Hereinafter, description of content which is the same as in the first embodiment will be omitted.

Figure 3:
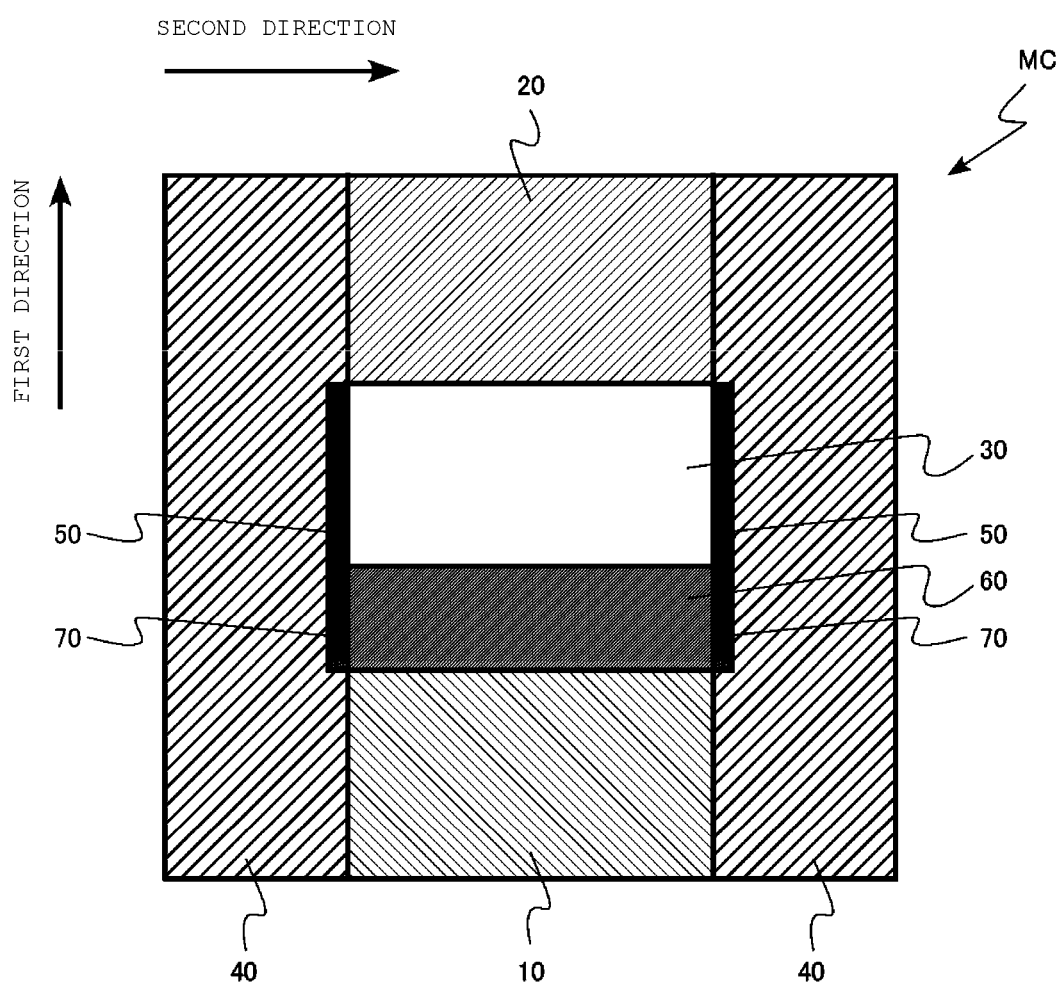
FIG. 3 is a schematic cross-sectional view of a memory cell of a storage device according to a second embodiment.

FIG. 3 is a schematic cross-sectional view of a memory cell of the storage device according to the second embodiment.

As shown in FIG. 3, the memory cell MC includes a lower electrode 10 (an example of a first conductive layer), an upper electrode 20 (an example of a second conductive layer), a resistance-variable layer 30, interlayer insulating layers 40 (an example of an insulating layer), first interface regions 50 (an example of a first region), a selector layer 60 (an example of an intermediate layer), and second interface regions 70 (an example of a second region).

The selector layer 60 is provided between the lower electrode 10 and the resistance-variable layer 30.

The selector layer 60 includes a second chalcogenide. The second chalcogenide includes a second element which is either silicon (Si) or germanium (Ge).

The second chalcogenide included in the selector layer 60 is different from the first chalcogenide included in the resistance-variable layer 30. The second element contained in the second chalcogenide may be either the same as or different from the first element contained in the first chalcogenide.

The second chalcogenide is, for example, a chalcogenide containing silicon (Si) and tellurium (Te). The second chalcogenide is, for example, a chalcogenide containing germanium (Ge) and tellurium (Te). The second chalcogenide is, for example, a chalcogenide containing aluminum (Al) and tellurium (Te). The second chalcogenide is, for example, a chalcogenide containing antimony (Sb) and tellurium (Te). The second element is, for example, silicon.

The selector layer 60 has non-linear voltage-current characteristic. A large difference occurs in a current flowing through the selector layer 60 between when a low voltage is applied to the selector layer 60 and when a high voltage is applied to the selector layer 60. Providing the selector layers 60, for example, reduces a current flowing through memory cells MC other than a selected memory cell MC, and prevents incorrect writing of data and incorrect reading of data.

The chemical formulation of the second chalcogenide is not limited as long as it is a chalcogenide having non-linear voltage-current characteristic.

The second interface regions 70 are provided between the selector layer 60 and the interlayer insulating layers 40. The second interface regions 70 are provided on side surfaces of the selector layer 60. The second interface regions 70 have a sixth concentration of the second element higher than both a fourth concentration of the second element of the selector layer 60 and a fifth concentration of the second element of the interlayer insulating layers 40.

For example, when the second element is silicon, the concentration of silicon of the second interface regions (i.e., the sixth concentration) is higher than both the concentration of silicon of the selector layer 60 (i.e., the fourth concentration) and the concentration of silicon of the interlayer insulating layers 40 (i.e., the fifth concentration).

The second interface regions 70 are regions formed by segregation of the second element at the interfaces between the selector layer 60 and the interlayer insulating layers 40. The width in the second direction of the second interface regions 70 is, for example, less than 0.5 nm or less than 0.4 nm.

For example, when the second chalcogenide included in the selector layer 60 is a chalcogenide containing silicon (Si) and tellurium (Te), and the interlayer insulating layers 40 are silicon oxide, the second interface regions 70 are, for example, silicon oxide having a high silicon concentration.

Next, an example of a method of manufacturing the memory cell MC according to the second embodiment will be described.

For example, when the selector layer 60 is formed on the lower electrode 10 by the ALD method, the second chalcogenide is formed to contain the surplus second element compared with the second element that can be stably contained in the second chalcogenide.

For example, when the second chalcogenide included in the selector layer 60 is a chalcogenide containing silicon (Si) and tellurium (Te), the chemical formulation of $Si_2Te_3$ is stable. Therefore, for example, the second chalcogenide is formed to contain surplus silicon compared with the chemical formulation.

Then, the resistance-variable layer 30, the upper electrode 20, and the interlayer insulating layers 40 are formed. The interlayer insulating layers 40 are formed in contact with the side surfaces of the resistance-variable layer 30 and the selector layer 60.

Next, annealing is performed at, for example, a temperature of 500° C. or higher and 900° C. or lower. The annealing is performed for, for example, 1 second to 3 seconds. Through such annealing, the surplus second element segregates at the interfaces between the selector layer 60 and the interlayer insulating layers 40, and the second interface regions 70 are formed.

The phase change memory according to the second embodiment has the second interface regions 70 having a high concentration of the second element between the selector layer 60 and the interlayer insulating layers 40. The second interface regions 70 having the high concentration of the second element improves adhesion between the selector layer 60 and the interlayer insulating layers 40.

For example, when the second chalcogenide included in the selector layer 60 is a chalcogenide containing silicon (Si) and tellurium (Te), and the interlayer insulating layers 40 are silicon oxide, the second interface regions 70 are, for example, silicon oxide containing silicon at a high concentration. The second element is silicon.

By compounding silicon oxide containing silicon at the high concentration and the second chalcogenide containing silicon, adhesion between the selector layer 60 and the interlayer insulating layers 40 is improved.

A metal layer may be provided between the resistance-variable layer 30 and the selector layer 60.

As described above, according to the storage device according to the second embodiment, in addition to the adhesion between the resistance-variable layer and the insulating layers, the adhesion between the selector layer and the insulating layers increases as well. Therefore, film peeling between the resistance-variable layer and the insulating layers and film peeling between the selector layer and the insulating layers are unlikely to occur during manufacture. Thereby, a storage device that can be stably manufactured is achieved.

Third Embodiment

A storage device of a third embodiment is the same as that of the first embodiment except that a memory cell array has a three-dimensional structure. Therefore, description of content that is the same as in the first embodiment will be omitted.

Figure 4:
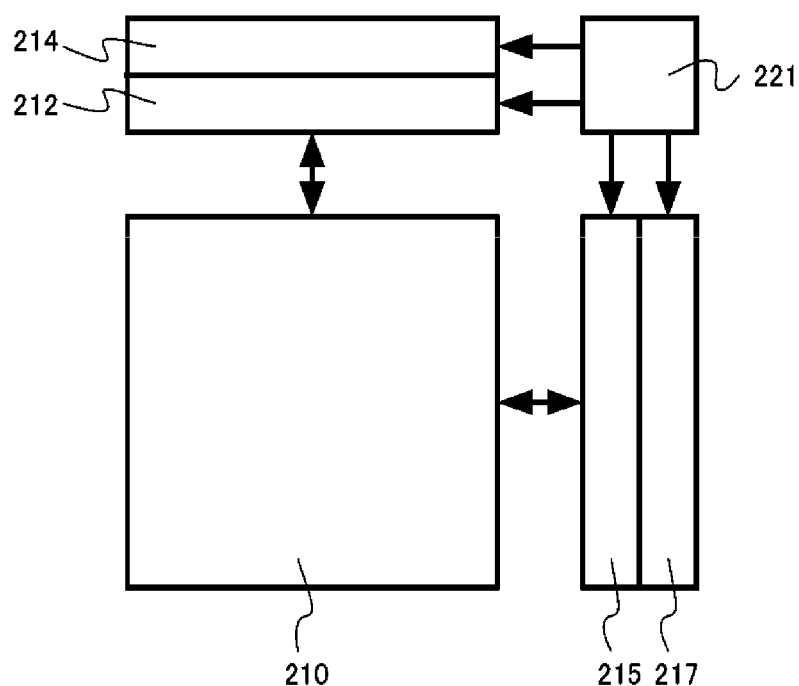
FIG. 4 is a block diagram of a storage device according to a third embodiment.
Figure 5:
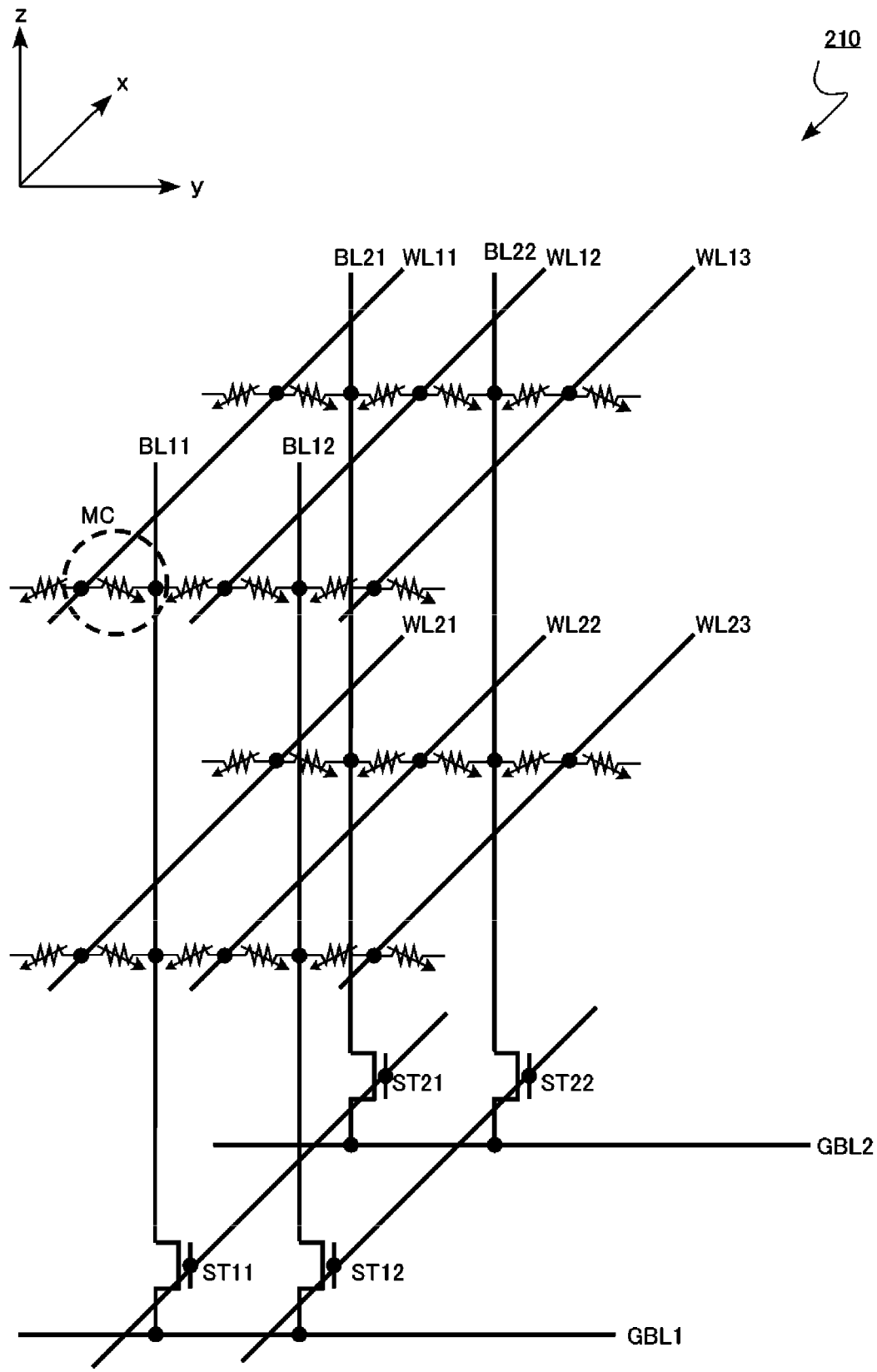
FIG. 5 is an equivalent circuit diagram of a memory cell array of the storage device according to the third embodiment.
Figure 6:
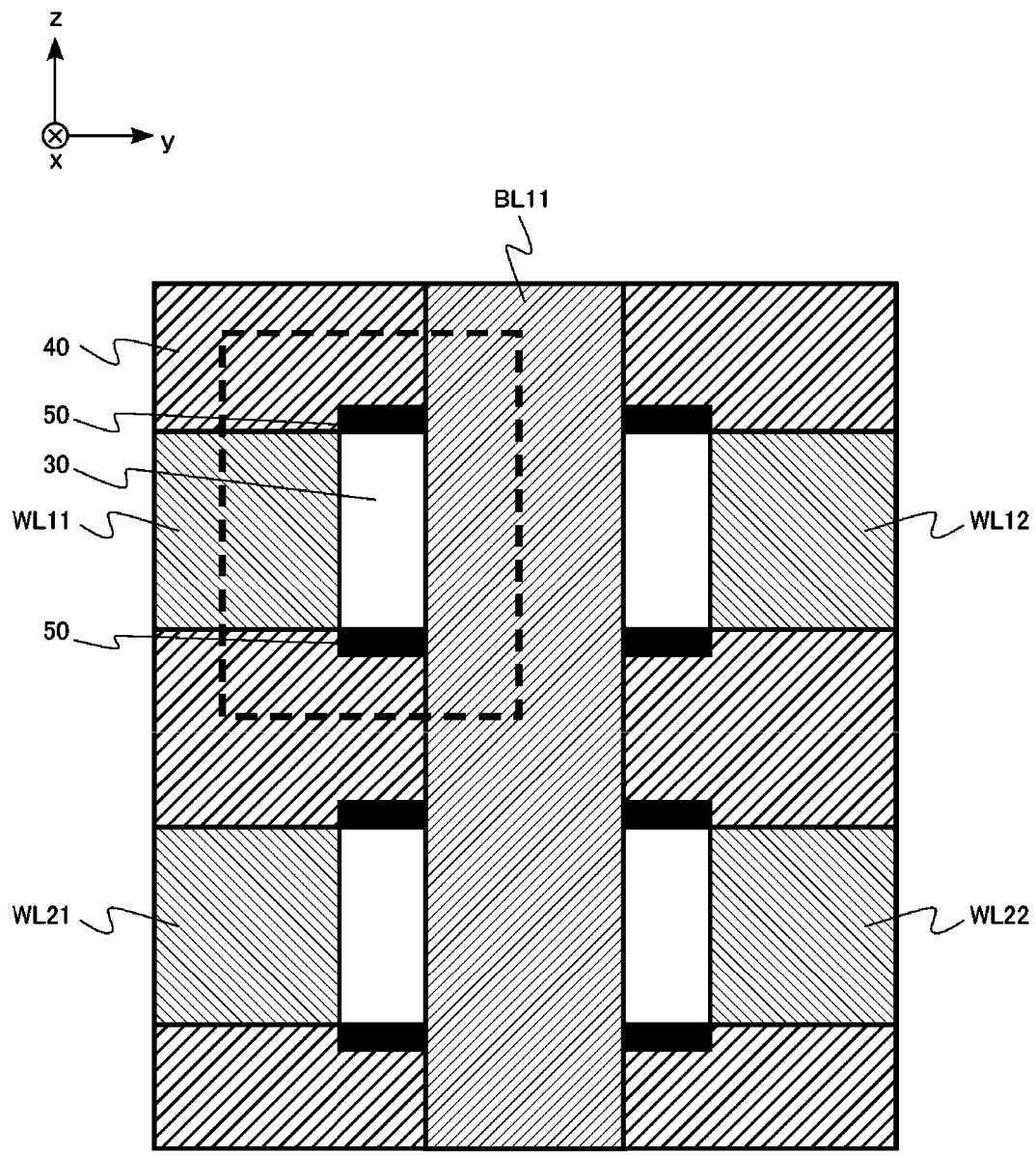
FIG. 6 is a schematic cross-sectional view of the memory cell array of the storage device according to the third embodiment.

FIG. 4 shows a block diagram of the storage device according to the third embodiment. FIG. 5 is an equivalent circuit diagram of the memory cell array of the storage device according to the third embodiment. FIG. 6 is a schematic cross-sectional view of the memory cell array of the storage device according to the third embodiment.

The memory cell array according to the third embodiment has a three-dimensional structure in which memory cells MC are arranged three-dimensionally.

As shown in FIG. 4, the storage device according to the third embodiment includes a memory cell array 210, a word line driver circuit 212, a row decoder circuit 214, a sense amplifier circuit 215, a column decoder circuit 217, and a control circuit 221.

As shown in FIG. 5, a plurality of memory cells MC are arranged three-dimensionally in the memory cell array 210. In FIG. 5, a region surrounded by a broken line corresponds to one memory cell MC.

The memory cell array 210 includes, for example, a plurality of word lines WL (WL11, WL12, WL13, WL21, WL22, WL23) and a plurality of bit lines BL (BL11, BL12, BL21, BL22). The word lines WL extend in an x direction. The word lines WL are arranged in a y direction (an example of a first direction). The bit lines BL extend in a z direction (an example of a second direction). The word lines WL and the bit lines BL intersect one another perpendicularly. The memory cells MC are arranged at intersections of the word lines WL and the bit lines BL.

The plurality of word lines WL are electrically connected to the row decoder circuit 214. The plurality of bit lines BL are connected to the sense amplifier circuit 215. Select transistors ST (ST11, ST21, ST12, and ST22) and global bit lines GBL (GBL1 and GBL2) are provided between the plurality of bit lines BL and the sense amplifier circuit 215.

The row decoder circuit 214 has a function of selecting a word line WL in accordance with an input row address signal. The word line driver circuit 212 has a function of applying a predetermined voltage to the word line WL selected by the row decoder circuit 214.

The column decoder circuit 217 has a function of selecting a bit line BL in accordance with an input column address signal. The sense amplifier circuit 215 has a function of applying a predetermined voltage to the bit line BL selected by the column decoder circuit 217. Moreover, the sense amplifier circuit 215 has a function of detecting and amplifying a current flowing between the selected word line WL and the selected bit line BL.

The control circuit 221 has a function of controlling the word line driver circuit 212, the row decoder circuit 214, the sense amplifier circuit 215, the column decoder circuit 217, and other circuits (not shown).

Circuits such as the word line driver circuit 212, the row decoder circuit 214, the sense amplifier circuit 215, the column decoder circuit 217, and the control circuit 221 are configured with, for example, a transistor or a wiring layer using a semiconductor layer (not shown).

FIG. 6 shows a schematic cross-sectional view of the memory cell array 210 of the storage device according to the third embodiment. FIG. 6 is a yz cross-sectional view of the memory cell array 210. In FIG. 6, a region surrounded by a broken line is one memory cell MC.

The memory cell array 210 includes the word line WL11 (an example of a first conductive layer), the word line WL12, the word line WL21, the word line WL22, and the bit line BL11 (an example of a second conductive layer). The memory cell array 210 further includes the resistance-variable layer 30, the interlayer insulating layers 40 (an example of an insulating layer), and the first interface regions 50 (an example of a first region).

As described above, according to the storage device according to the third embodiment, similarly to the first embodiment, adhesion between the resistance-variable layer and the insulating layers increases. Therefore, film peeling between the resistance-variable layer and the insulating layers is unlikely to occur during manufacture. Thereby, a storage device that can be stably manufactured is achieved. Further, in addition to the advantageous effects of the first embodiment, the three-dimensional structure improves the integration degree of the storage device.

A selector layer similar to that of the second embodiment may be provided to the memory cell MC of the storage device according to the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. An element of an embodiment may be substituted by an element of another embodiment or may be changed. The accompanying claims and their equivalents are intended to cover such forms or modifications as would fall within the scope and spirit of the inventions.

What is claimed is:

1. A storage device comprising:
   a first conductive layer;
   a second conductive layer;
   a resistance-variable layer disposed between the first conductive layer and the second conductive layer, and including a first chalcogenide containing a first element which is either silicon or germanium;
   an insulating layer disposed in a second direction perpendicular to a first direction, the first direction being from the first conductive layer to the second conductive layer with respect to the resistance-variable layer; and
   a first region disposed between the resistance-variable layer and the insulating layer, and having a third concentration of the first element higher than both a first concentration of the first element in the resistance-variable layer and a second concentration of the first element in the insulating layer.

2. The storage device according to claim 1 further comprising:
   an intermediate layer disposed between the first conductive layer and the resistance-variable layer, and including a second chalcogenide containing a second element which is either silicon or germanium; and
   a second region disposed between the intermediate layer and the insulating layer, and having a sixth concentration of the second element higher than both a fourth concentration of the second element in the intermediate layer and a fifth concentration of the second element in the insulating layer.

3. The storage device according to claim 2, wherein the first element and the second element are different from each other.

4. The storage device according to claim 2, wherein the first chalcogenide includes germanium, antimony, and tellurium, and
   the second chalcogenide includes silicon and tellurium.

5. The storage device according to claim 3, wherein the first chalcogenide includes germanium, antimony, and tellurium, and
   the second chalcogenide includes silicon and tellurium.

6. The storage device according to claim 1, wherein the insulating layer is silicon oxide, silicon nitride, or silicon oxynitride.

7. The storage device according to claim 2, wherein the insulating layer is silicon oxide, silicon nitride, or silicon oxynitride.

8. The storage device according to claim 1, wherein a width in the second direction of the first region is less than 0.5 nm.

9. The storage device according to claim 2, wherein a width in the second direction of the first region is less than 0.5 nm.

10. The storage device according to claim 1, wherein the first region is disposed on opposing sides of the resistance-variable layer.

11. A storage device array, comprising:
    a plurality of storage devices according to claim 1 arranged in an array.

12. The storage device array of claim 11, further comprising:
    a plurality of word lines connected respectively to the first conductive layers of the storage devices.

13. The storage device array of claim 11, further comprising:
    a plurality of bit lines connected respectively to the second conductive layers of the storage devices.

14. The storage device array of claim 11, wherein the storage devices are arranged three-dimensionally.

* * * * *